(12) United States Patent
Chan et al.

(10) Patent No.: US 9,905,455 B2
(45) Date of Patent: Feb. 27, 2018

(54) METHOD FOR FORMING CONTACT VIAS

(71) Applicant: IMEC VZW, Leuven (BE)

(72) Inventors: Boon Teik Chan, Leuven (BE); Safak Sayan, Leuven (BE)

(73) Assignee: IMEC VZW, Leuven (BE)

( * ) Notice: Subject to any disclaimer, the term of this patent is extended or adjusted under 35 U.S.C. 154(b) by 136 days.

(21) Appl. No.: 14/919,226

(22) Filed: Oct. 21, 2015

(65) Prior Publication Data

US 2016/0118295 A1     Apr. 28, 2016

(30) Foreign Application Priority Data

Oct. 22, 2014   (EP) .................................... 14189847

(51) Int. Cl.
| | |
|---|---|
| H01L 21/4763 | (2006.01) |
| H01L 21/302 | (2006.01) |
| H01L 21/461 | (2006.01) |
| H01L 23/48 | (2006.01) |
| H01L 23/52 | (2006.01) |
| H01L 29/40 | (2006.01) |
| H01L 21/768 | (2006.01) |
| H01L 21/3105 | (2006.01) |
| H01L 21/311 | (2006.01) |

(52) U.S. Cl.
CPC .. *H01L 21/76816* (2013.01); *H01L 21/31051* (2013.01); *H01L 21/31144* (2013.01); *H01L 21/76807* (2013.01)

(58) Field of Classification Search
CPC ......... H01L 21/76816; H01L 21/31144; H01L 21/76802; H01L 21/76807; H01L 21/76811

USPC ................ 257/774, 758, E21.577, E21.579; 438/637, 736

See application file for complete search history.

(56) References Cited

U.S. PATENT DOCUMENTS

| | | |
|---|---|---|
| 7,767,099 B2 | 8/2010 | Li et al. |
| 8,486,611 B2 | 7/2013 | Millward et al. |
| 8,715,917 B2 | 5/2014 | Holmes et al. |
| 2007/0224819 A1 | 9/2007 | Sandhu |
| 2008/0093743 A1 | 4/2008 | Yang et al. |
| 2008/0176767 A1* | 7/2008 | Millward ............ B81C 1/00031 506/20 |
| 2008/0182402 A1 | 7/2008 | Li et al. |
| 2012/0015486 A1 | 1/2012 | Millward et al. |
| 2013/0210226 A1 | 8/2013 | Seino |

(Continued)

OTHER PUBLICATIONS

European Search Report, European Patent Application No. 14189847.8, dated Apr. 24, 2015.

*Primary Examiner* — Fernando L Toledo
*Assistant Examiner* — Aaron Gray
(74) *Attorney, Agent, or Firm* — McDonnell Boehnen Hulbert & Berghoff LLP (57) ABSTRACT

A method for forming contact vias includes providing a substrate comprising a plurality of contact structures embedded in a first dielectric layer, the contacts abutting an upper surface of the first dielectric layer. The method also includes providing a second dielectric layer on the upper surface of the first dielectric layer, and providing contact vias in the second dielectric layer by patterning the second dielectric layer at least at positions corresponding to the contact structures, wherein patterning the second dielectric layer comprises using a DSA patterning technique.

13 Claims, 8 Drawing Sheets

(56) References Cited

U.S. PATENT DOCUMENTS

| | | | |
|---|---|---|---|
| 2014/0091476 A1* | 4/2014 | Nyhus | H01L 23/5226 |
| | | | 257/774 |
| 2014/0097520 A1* | 4/2014 | Millward | H01L 21/76816 |
| | | | 257/622 |
| 2014/0148012 A1 | 5/2014 | Guillorn et al. | |
| 2014/0242799 A1* | 8/2014 | Takakuwa | H01L 21/76802 |
| | | | 438/702 |
| 2015/0050794 A1* | 2/2015 | Kim | H01L 21/76816 |
| | | | 438/382 |

\* cited by examiner

METHOD FOR FORMING CONTACT VIAS

CROSS-REFERENCE TO RELATED APPLICATION

The present application is a non-provisional patent application claiming priority to European Patent Application No. 14189847.8 filed Oct. 22, 2014, the contents of which are hereby incorporated by reference.

TECHNICAL FIELD

The present disclosure relates to a method for forming contact vias used for contacting contact structures in a semiconductor device.

BACKGROUND

Directed Self Assembly (DSA) has become an important research topic for advanced patterning solution in future technology nodes, particularly for contacting applications. It is important to control the contact hole pattern placement accuracy, which should be compatible with the current and future CMOS integration processes.

One option is to use a template DSA process, whereby a template layer is used to define openings in which a Block CoPolymer (BCP) is applied and on which the DSA process is applied.

The contact hole pattern placement accuracy then depends to a large extend on the controlling of the DSA process involved.

There is a desire for methods for improving the contact hole or via pattern placement accuracy when these structures are being patterned by DSA.

SUMMARY OF THE DISCLOSURE

It is an aim of the present disclosure to provide a method for forming contact vias with improved pattern placement accuracy.

This aim is achieved according to the disclosure with the method showing the technical characteristics disclosed herein.

In one example, a method for forming contact vias (also called through holes) includes providing a substrate comprising a plurality of contact structures embedded in a first dielectric layer, the contacts abutting an upper surface of the first dielectric layer. The method also includes providing a second dielectric layer on the upper surface of the first dielectric layer, and providing contact vias in the second dielectric layer by patterning the second dielectric layer at least at positions corresponding to the contact structures. Further, the method includes providing a hardmask layer on top of the second dielectric layer, and patterning the hardmask layer to thereby remove a portion of the hardmask layer, thereby leaving at least an upper portion of the hardmask layer at positions where no vias in the second dielectric layer are needed or are to be formed. In this example, the method includes providing a patterned planarizing template layer on top of the patterned hardmask layer and on the second dielectric layer, if and where the hardmask layer is completely removed. The patterned template layer includes a set of openings, and the set of openings are evenly distributed within the template layer. The set of openings further include or consist of a limited number of subsets of openings of identical size, and at least some of the openings correspond to (for instance comprising or enclosing) the positions of the contact structures. This example method also includes performing a DSA process comprising providing a predetermined Block Copolymer (BCP) material in all of the openings of the template layer, inducing polymer separation of the BCP in the openings, and removing of one component of the BCP in the openings. The patterned template layer and second component of the BCP together define a pattern comprising DSA openings, which may be evenly distributed over the hardmask layer and the second dielectric layer, and the DSA openings are located at positions corresponding to the contact structures. In addition, the method includes etching the contact vias in the second dielectric layer, using at least the second DSA component (and for instance also the template layer and/or portions of the hardmask layer) as a mask.

The plurality of contact structures can be/preferably is a predetermined subset of all of the contact structures present in the first dielectric layer. Indeed, not all contact structures may need to be contacted.

Generally, openings of identical size are openings having substantially identical dimensions or volume. For instance, openings of identical size have identical dimensions, e.g., have identical depth, width, and length. The openings may also have identical or substantially identical dimensions, when neglecting small differences due to the processing used to produce them.

According to example embodiments, the pattern defined by the openings in the template layer has a uniform or substantially uniform pattern density. The pattern density can be considered as the ratio of the opened area (defined by the openings) over the unit area in the template layer. The value of the uniform or substantially uniform pattern density may be optimized/predetermined for a specific process/BCP system.

It is a potential advantage of embodiments of the present disclosure that by providing template layer openings being evenly distributed within the template layer, the set of openings comprising, or consisting of, a limited number of subsets of openings of identical size all across the wafer, a very similar filling of BCP material occurs in all of the openings. In the disclosed process flow, this finally results in an improved pattern placement accuracy. By leaving (e.g., having it to remain) at least an upper portion of the hardmask layer (for instance, a portion of a single hardmask layer, or in the case of a hardmask layer being embodied by a bilayer structure, a portion of an upper layer) at positions where no vias in the second dielectric layer are needed or will be formed, any "unwanted" via pattern transfer will be blocked.

In one example, the hardmask layer (or upper layer in case of a bilayer structure) is thin enough as to not influence a uniform filling of the BCP. For instance, the hardmask layer can have a thickness within the range of 2 nm to 15 nm. For instance, the single hardmask layer can have a thickness within the range of 2 nm to 15 nm. For instance, the upper layer in case of a bilayer structure can have a thickness within the range of 2 nm to 15 nm.

According to example embodiments, providing a Block Copolymer (BCP) in all of the openings of the template layer comprises not overfilling the openings. This process may comprise filling the openings up to or between about 50% to 100% of a volume or height of the openings, about 50% to 80% of the volume or height, and/or about 50% to 60% of the volume or height. In another view, the holes are filled up until a level lying in the range of 50% to 100% of the height of the openings, in the range of 50% to 80% of the height of the openings, and/or in the range of 50% to 60% of the height of the openings. In one example, all the holes are filled up until about the same level.

According to embodiments, the limited number of subsets of openings of identical size is one or two.

According to embodiments, all openings have identical size (e.g., there is only one subset of openings of identical size), and the openings are arranged according to a regular grid pattern.

According to embodiments, the openings are oriented in the same direction.

According to embodiments, at least one opening is oriented in a different direction.

According to embodiments, a subset of openings comprises openings with dimensions adapted as to form one-hole, two-hole, or three-hole structures in the BCP, for the predetermined BCP material, based on predetermined natural periodicity of the BCP material.

According to embodiments, there are only two subsets of openings of identical size, the respective sizes of openings of the first subset and of the second subset being predetermined such that respectively two vias and three vias are formed in the openings for the predetermined BCP material used.

According to embodiments, the openings in the template layer are rectangular or square in cross-section along a plane parallel to a main front surface of the substrate.

According to embodiments, providing a hardmask layer on top of the second dielectric layer comprises providing a single layer of metal material as a hardmask layer, and patterning the hardmask layer is performed directly thereafter.

According to embodiments, providing a hardmask layer on top of the second dielectric layer comprises providing a bilayer structure that includes a first layer of a metal material (sometimes referred to as embedded hardmask layer) and a second layer of a dielectric material directly on top of the first layer of metal material (sometimes referred to as cut block layer), and the method further comprises patterning only the second layer of a dielectric material directly thereafter by using a lithography process which is selective to the first layer of metal material.

According to embodiments, patterning the hardmask layer comprises patterning the first layer of metal material only after defining the DSA openings, before or at the same time of etching the contact vias in the second dielectric layer.

According to embodiments, the method comprises, after patterning the single hardmask layer or only the second layer of the dielectric layer of the hardmask layer, providing a planarizing layer or layer stack on the substrate, on top of the patterned hardmask layer and the second dielectric layer; and patterning the planarizing layer or layer stack by using a lithography process, to thereby define the patterned template layer.

BRIEF DESCRIPTION OF THE DRAWINGS

The disclosure will be further elucidated by the following description and the appended figures.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, are to be construed as example manners in which the disclosure may be implemented rather than as limiting the scope of the disclosure.

FIGS. 1(a) to 1(i) illustrate a process flow according to an embodiment of the present disclosure. A substrate is provided comprising a plurality of contact structures 5 (e.g. Tungsten plugs) embedded in a first dielectric layer 41, the contacts abutting an upper surface of the first dielectric layer 41. A second dielectric layer 42 is provided on the upper surface of the first dielectric layer 41. The first and second dielectric layers can, for instance, each comprise or consist of $SiO_2$, SOC, $SiO_2/Si_3N_4$, other dielectric or planarizing stacks. A metal hardmask sacrificial layer (hardmask layer) 2, 3 is provided on top of the second dielectric layer. Here, the hardmask layer is a bilayer structure: it comprises a lower layer, a metal hardmask 3, which comprises for instance TiN (or AlN, spin-on $TiO_2$, WO, ZrO etc.), and an upper layer, a dielectric hardmask 2 comprising for instance $Si_3N_4$ (or $SiO_2$, SiON, SiOC, etc.). The upper layer 2 may be selectively removable with respect to the first layer 3.

A photoresist (PR) layer 1 is provided on top of the hardmask layer and a photolithography process is applied in order to pattern the photoresist layer. The PR layer is used to pattern at least the upper layer 2 of the hardmask layer, the latter remaining in (e.g. on or over) regions where no vias in the second dielectric layer 42 are needed or will be formed (FIGS. 1(a) and 1(b)). For instance, a plasma etch to open the $Si_3N_4$ can be used, which is selective to TiN. The remaining photoresist layer 1 is removed (FIG. 1(c)). A planarization template layer 6, for instance a layer comprising a (spin-on-glass (SoG) and/or spin-on carbon (SoC) layer; here a combination of both, having the SoG layer first/lower in the stack) is provided on top of the patterned hardmask layer 2, 3. The template layer 6 is patterned by means of another photoresist layer 1 and a photolithography step, after which a plasma etch may be performed in the SoG/SoC template layer, stopping at the $Si_3N_4$ and TiN hardmask layers.

Figure 1A:
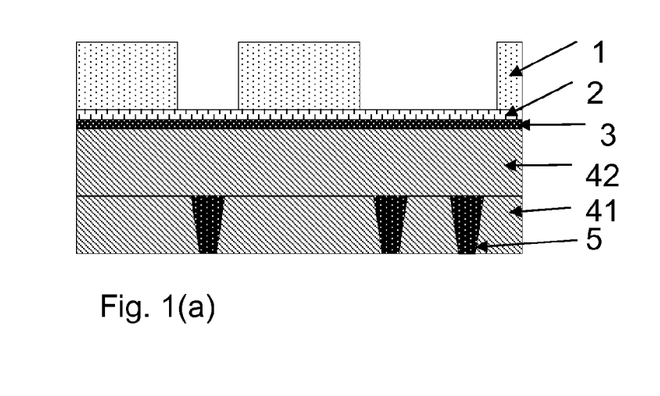
FIGS. 1(a) to 1(j) illustrate a process flow according to an embodiment of the present disclosure.
Figure 1B:
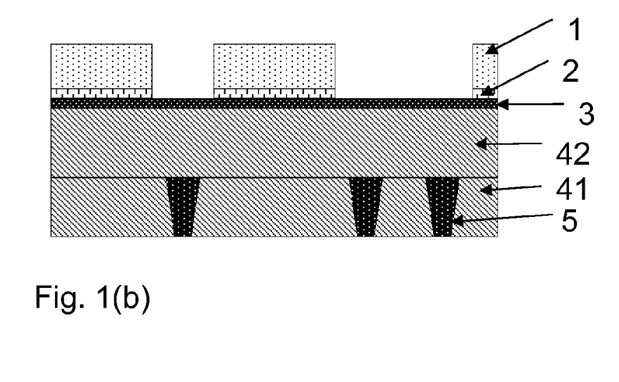
Figure 1C:
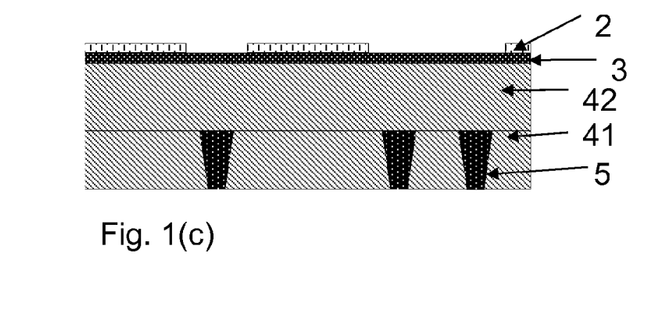
Figure 1D:
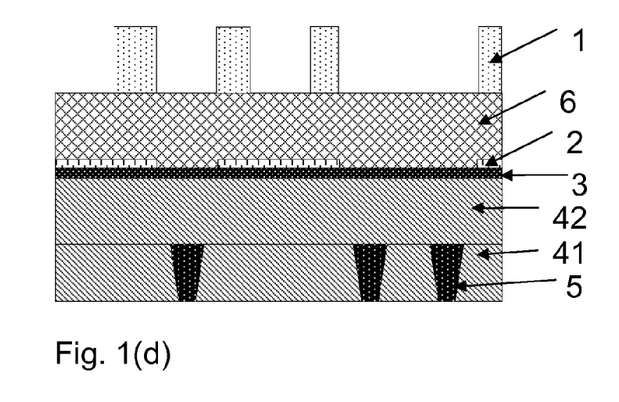
Figure 1E:
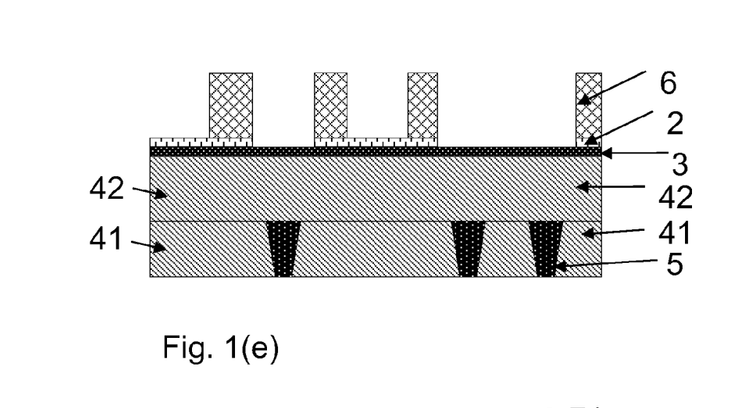
Figure 1F:
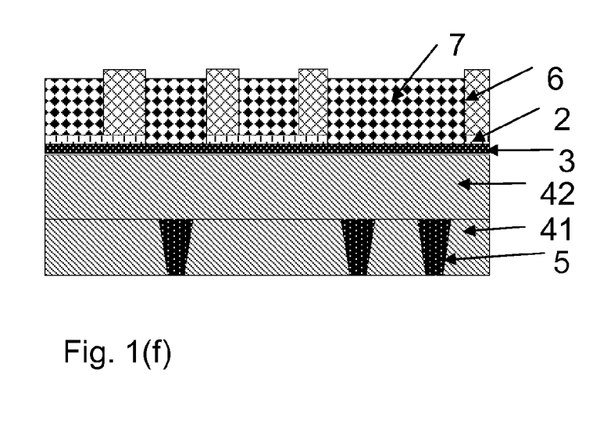
Figure 1G:
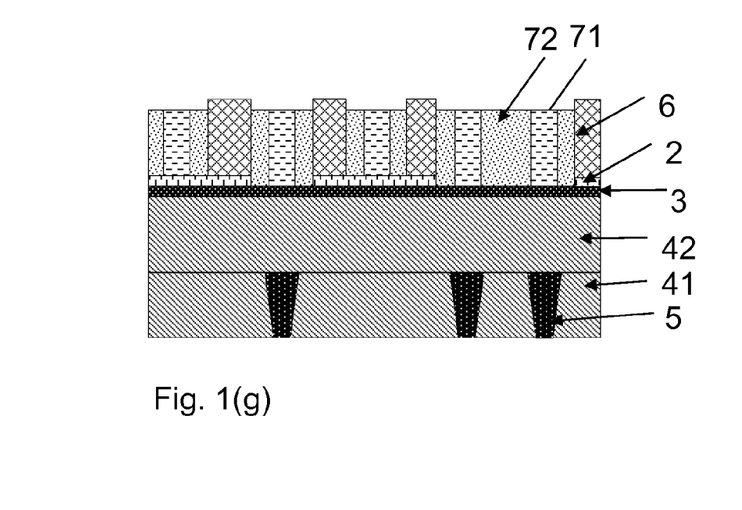

The template layer is patterned in order to comprise a set of openings, which are evenly distributed within the template layer 6 (FIGS. 1(d) and (e)). The set of openings in the template layer 6 may comprise, or consist of, a limited number of subsets of openings of identical size. In this case there is for instance a single set of openings, all having identical size, but oriented in two subsets of openings that are oriented orthogonally on each other. At least some of the template openings correspond to, e.g., enclose and/or are suitably aligned with, the positions of the contact structures 5 which need to be contacted. Template openings may be provided at all locations where contact structures 5 need to be contacted. The other openings, such as openings which do not correspond with the positions of the contact structures 5 which need to be contacted, serve as dummy openings.

The openings are evenly distributed over the full substrate/wafer in order to allow a uniform filling characteristic of the openings over the substrate's surface. This helps to facilitate filling of all of the openings with BCP material 7 (e.g., PS-PMMA or high-chi ($\chi$) BCP systems, Tri-block BCP), without overfilling or underfilling (some of) the openings (FIG. 1(f)). The parameter Chi ($\chi$) is an interaction parameter that is known to the skilled person, and which describes the degree of attraction/repelling of two polymer blocks to/from each other. $\chi$ is inverse proportional to the natural periodicity of the BCP material, $L_0$. So the higher the $\chi$ value, the smaller the distance/pitch for the block-copolymer. For instance, PS-b-PMMA has a $\chi$-value of 0.035.

In one example, when applying the BCP material, for instance by a spin-on technique, the pattern density of the template holes and their total accumulated volume is hereby also taken into account. An appropriate anneal step is performed in order to induce polymer separation into central pillar portions 71 (e.g., 1, 2, or 3 depending on the size of the openings and the natural periodicity of the BCP material) and a surrounding or embedding portion 72 of the BCP in the template openings (FIG. 1(g)). The component forming the pillar structures 71 of the BCP is removed (e.g., PMMA component; by wet or dry etching, for instance), leaving the second component 72 (PS) within the template openings (FIG. 1(h)). The patterned template layer 6 and second component 72 of the BCP together define a pattern comprising DSA openings, and the DSA openings are located, or at least located, at positions corresponding to the contact structures to be contacted. Then, the hardmask layer is opened (FIG. 1(i)) and contact vias 40 are provided in the second dielectric layer, using at least the second DSA component 72 as a mask (FIG. 1(j)). This can be performed in a single or in two or more steps. For instance, this may comprise a plasma etch into the metal hardmask and/or directly into the second dielectric layer. The formed vias can then be filled with a contact metal, for instance copper, which can be for instance electroplated. A CMP step can be applied to remove the excess of the copper and remove the TiN sacrificial layer simultaneously.

FIGS. 2(a) to 2(i) illustrate a process flow according to another embodiment of the present disclosure. A substrate is provided comprising a plurality of contact structures 5 (e.g. Tungsten plugs or MOA) embedded in a first dielectric layer 41, the contacts abutting an upper surface of the first dielectric layer 41. A second dielectric layer 42 is provided on the upper surface of the first dielectric layer 41. The first and second dielectric layer can for instance each comprise or consist of $SiO_2$, SOC, $SiO_2/Si_3N_4$, or other dielectric or planarizing stacks. The "planarizing" materials or layer(s) or layer stacks can be spin-coated, thereby planarizing any topography of the wafer. A metal hardmask sacrificial layer (hardmask layer) 3 is provided on top. Here, the hardmask layer 3 is a single metal hardmask, and can comprise for instance TiN (or AlN, spin-on $TiO_2$, WO, ZrO etc.). A photoresist layer 1 is provided on top and a photolithography step is applied in order to pattern the photoresist layer.

Figure 2A:
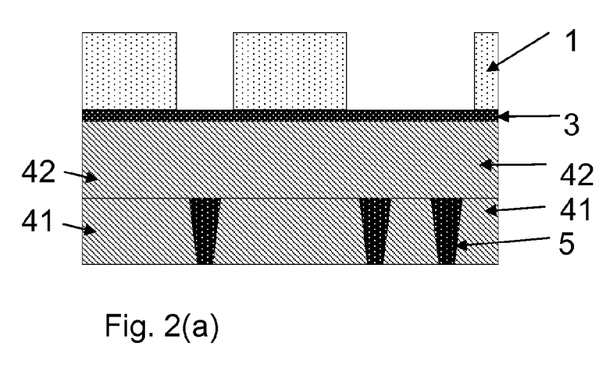
FIGS. 2(a) to 2(i) illustrate a process flow according to another embodiment of the present disclosure.
Figure 2B:
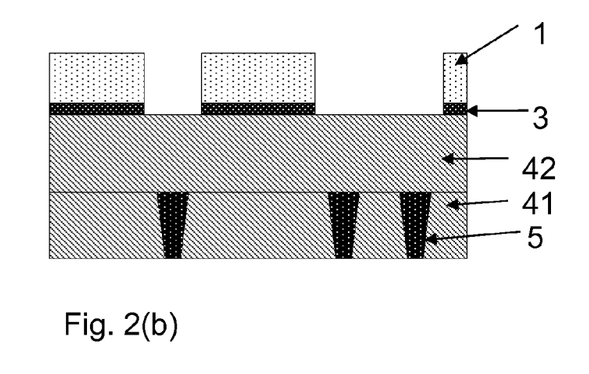
Figure 2C:
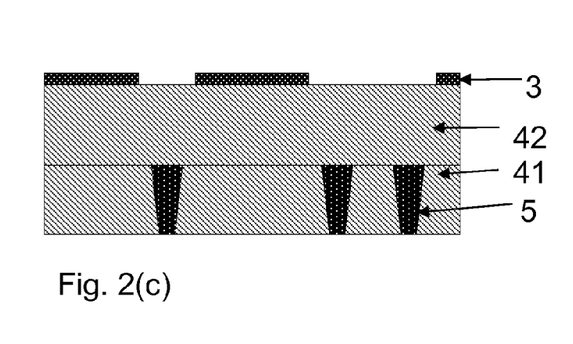

The photoresist layer 1 is used to pattern hardmask layer 3, the latter remaining in regions where no vias in the second dielectric layer 42 are needed or will be formed (FIGS. 2(a) and 2(b)). The remaining photoresist layer 1 is then removed (FIG. 2(c)). A planarization template layer 6, for instance a layer comprising a (spin-on-glass (SoG) and/or spin-on carbon (SoC) layer; or a combination of both, having the SoG layer first/lower in the stack) is provided on top of the patterned hard metal mask layer 3. The template layer 6 is patterned by means of another photoresist layer 1 and a photolithography step, after which a plasma etch is performed in the SoG/SoC template layer, stopping at the hardmask layer 3. A fluorine gas chemistry may be used to etch the SoG. The SoC material can for instance be etched with $N_2/H_2$ chemistry or $Ar/O_2$ chemistry.

Figure 2D:
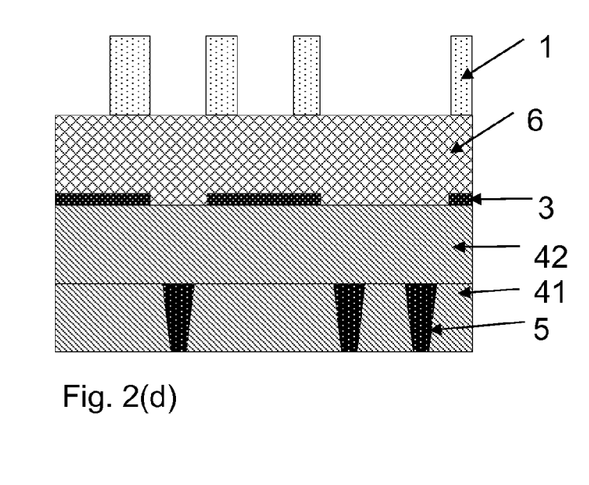
Figure 2E:
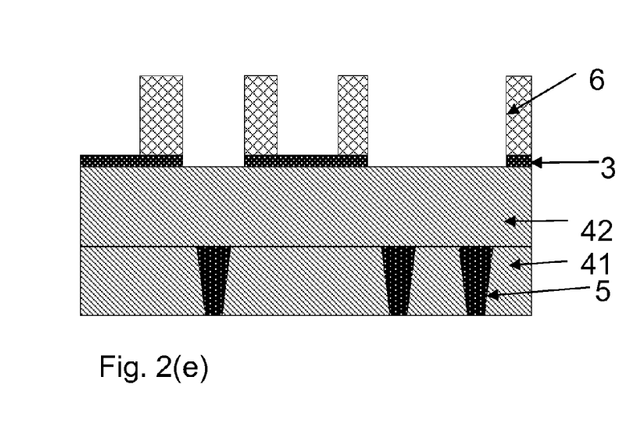
Figure 2F:
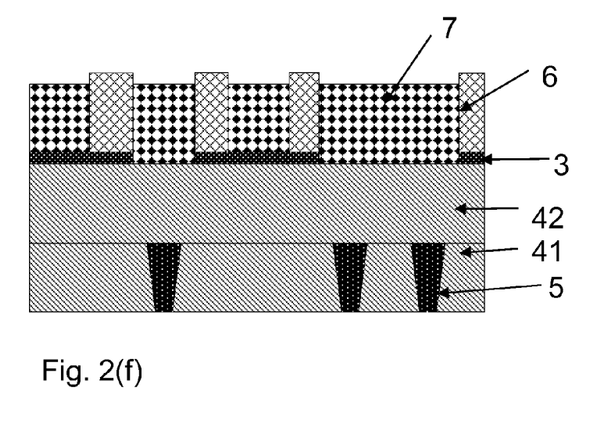
Figure 2G:
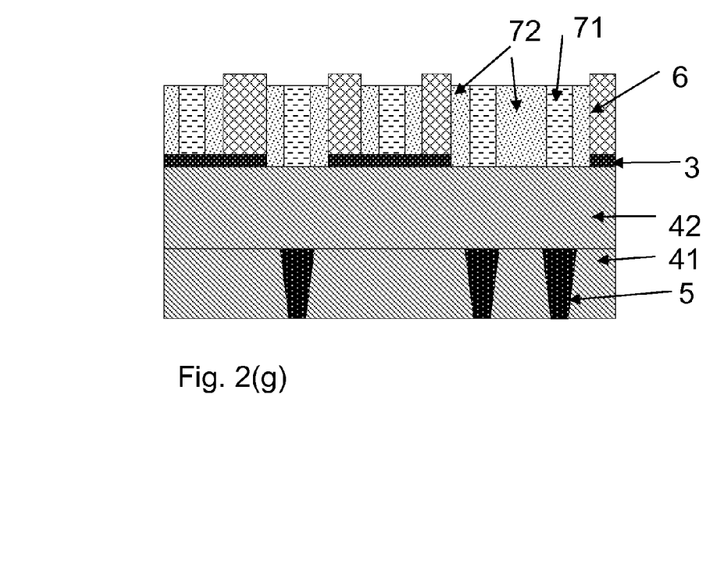

The template layer is patterned in order to comprise a set of openings, which are evenly distributed within the template layer 6 (FIGS. 2(d) and 2(e)). The set of openings in the template layer 6 may comprises, or consist of, a limited number of subsets of openings of identical size. In this case there is for instance a single set of openings, all having identical size, but oriented in two subsets of openings that are oriented orthogonally on each other. At least some of the template openings correspond to, e.g. enclose and/or are suitably aligned with, the positions of the contact structures 5 that need to be contacted. Template openings may be provided at all locations where contact structures 5 need to be contacted. The other openings, such as openings that are not corresponding with the positions of the contact structures 5 which need to be contacted, serve as dummy openings.

The openings are evenly distributed over the full substrate/wafer in order to allow a uniform filling characteristic of the openings over the substrate's surface. This helps to fill all of the openings with BCP material (e.g. PS-PMMA or high-chi BCP systems), without overfilling or underfilling (some of) them (FIG. 2(f)). When applying the BCP material, for instance by a spin-on technique, the pattern density of the template holes and their total accumulated volume may be hereby also taken into account. An appropriate anneal step is performed in order to induce polymer separation into central pillar portions 71 (e.g. 1, 2, or 3 depending on the size of the openings and the natural periodicity of the BCP material) and a surrounding or embedding portion 72 of the BCP in the template openings (FIG. 2(g)).

Figure 2H:
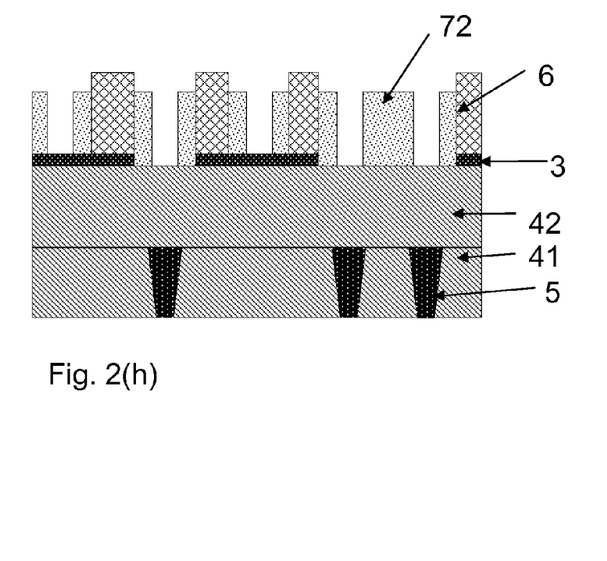

The pillar forming component 72 of the BCP is removed (e.g. PMMA component; by e.g. wet or dry etching), leaving the second component 72 (PS) within the template openings (FIG. 2(h)). The patterned template layer 6, the second component 72 of the BCP, and the patterned hardmask layer 3 together define a pattern comprising only DSA openings. Some of the DSA openings are located at positions corresponding to the contact structures to be contacted. Other DSA openings, of the dummy type, are provided above the metal hardmask 3.

Figure 2I:
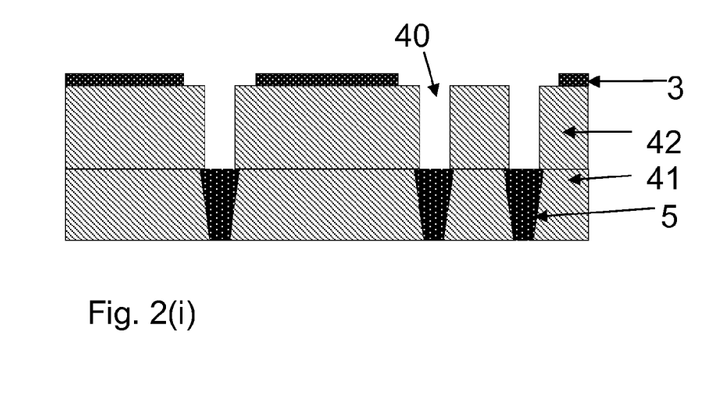

Then, contact vias 40 are provided in the second dielectric layer, using at least the second DSA component as a mask (for instance in combination with the template layer 6 and the hardmask layer 3) (FIG. 2(i)). In the regions where the hardmask layer 3 is still present, no via etch can occur as this is blocked by the hardmask layer 3

The formed vias can then be filled with a contact metal, for instance copper, which can be for instance electroplated. A CMP step can be applied to remove the excess of the copper and remove the remaining patterned hardmask layer 3 simultaneously.

The choice whether one would apply the process according to the embodiments disclosed herein may depend on the etch capability to transfer the templated DSA contact hole into a typical stack consisting of 100 nm thick $SiO_2$ and typically about 15 nm thick $Si_3N_4$ layers. If the templated DSA contact hole is too thin to etch into $SiO_2/Si_3N_4$, then the use of the metal hardmask is believed to increase the etch selectivity for contact hole pattern transfer. In processes according to the FIGS. 1(a)-1(j), the metal hardmask layer 3 is defining the contact hole etch in the underlying layer (e.g. the second dielectric layer 42). In processes according to the FIGS. 2(a)-2(i), the embedding portion 72 of the BCP is defining the contact hole etch.

Figure 1H:
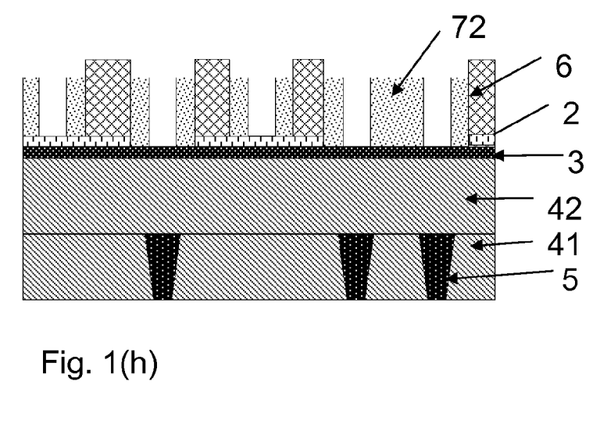
Figure 1I:
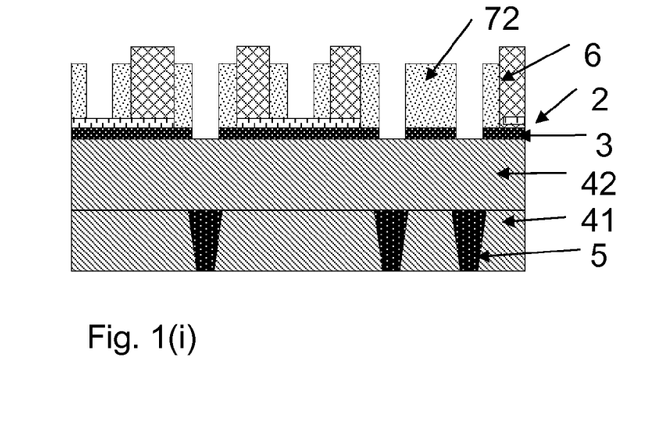
Figure 1J:
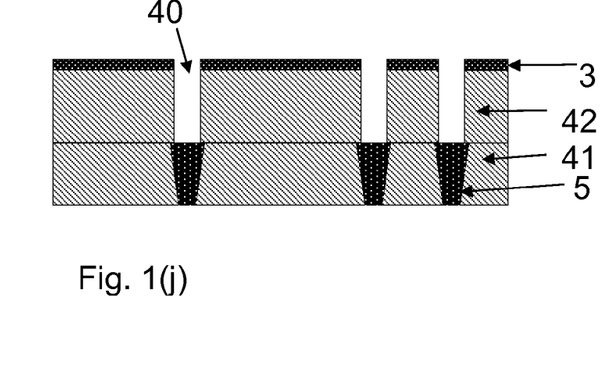
Figure 3A:
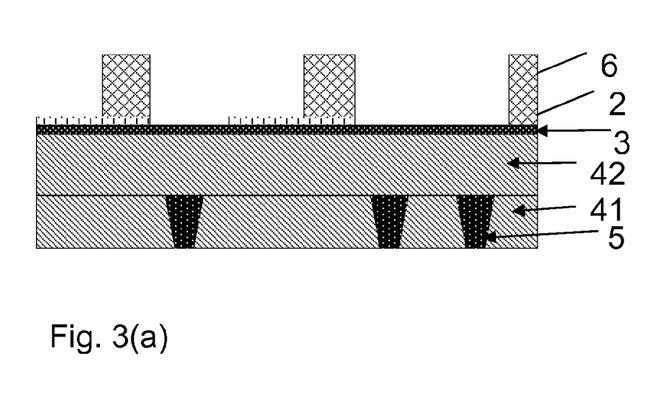
FIGS. 3(a) and 3(b) illustrate a process flow according to a further embodiment of the present disclosure.
Figure 3B:
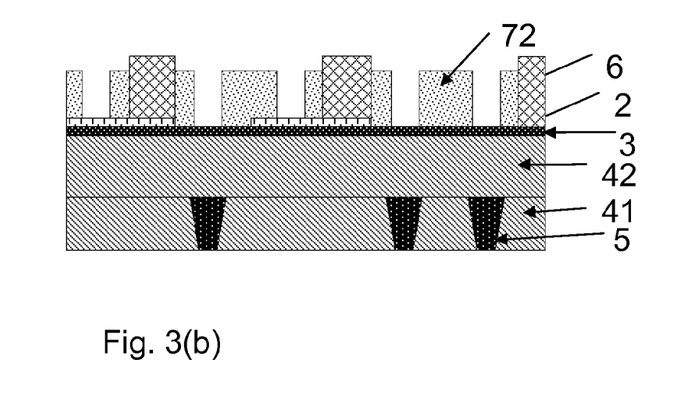

FIGS. 3(a) and 3(b) further illustrate a process flow of the that corresponds to FIGS. 1(e) and 1(h). In this example, the upper portion of the hardmask layer which is left at positions where no vias in the second dielectric layer are needed or will be formed, for instance layer 2, can also extend into the template openings if necessary, in order to block via formation in this area. The same concept may apply to the embodiment in FIGS. 2(a)-2(i); the hardmask layer 3 which is left at positions where no vias in the second dielectric layer are needed or will be formed, can also extend into the template openings if necessary, in order to block via formation in this area.

Figure 4A:
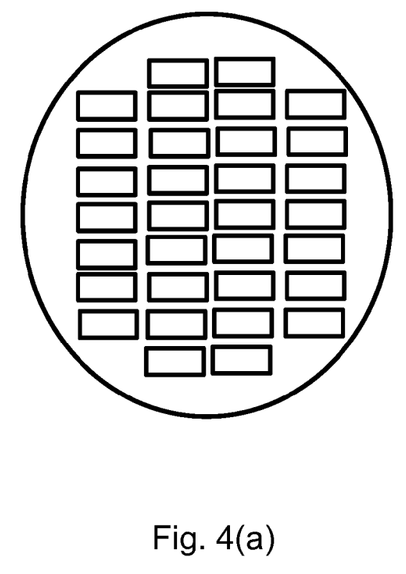
FIGS. 4(a) to 4(c) illustrate arrangements of template layer openings according to embodiments of the present disclosure.
Figure 4B:
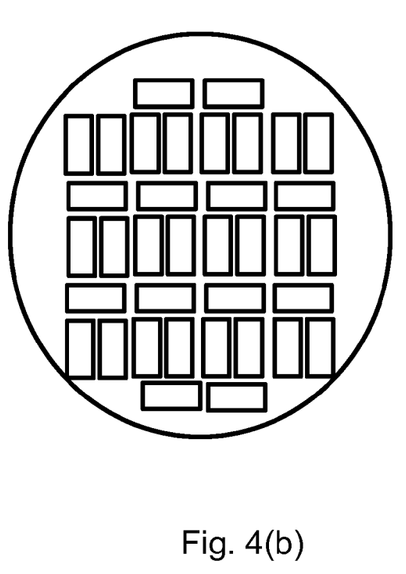
Figure 4C:
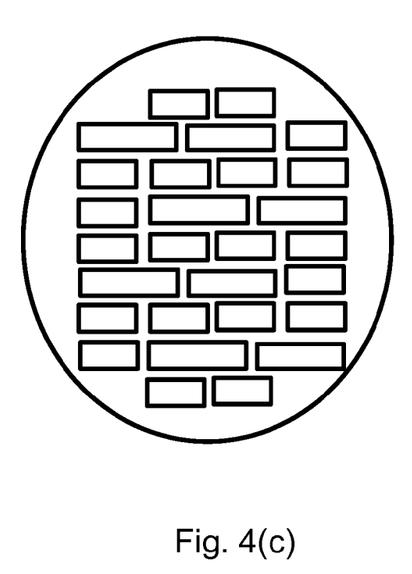

FIGS. 4(a) to 4(c) illustrate arrangements of template layer openings according to embodiments of the present disclosure. In FIG. 4(a), of the regular matrix type, all openings have identical size (e.g., there is only one subset of openings of identical size), and the openings are arranged according to a regular grid pattern. The openings are oriented in the same ("horizontal") direction.

In FIG. 4(b), all openings have identical size (e.g., there is only one subset of openings of identical size), and the openings are evenly or regularly distributed according to a different pattern from FIG. 4(a). At least one opening, or a first subset of openings is oriented in a different direction ("horizontal") than a second subset of openings, the latter being oriented under a relative angle of 90 degrees ("vertical"). The union of the first set and the second set constitute the complete set of openings.

According to another embodiment, illustrated in FIG. 4(c), the limited number of subsets of openings of identical size in the template layer is two. The openings of the first subset of openings have the same width but a different length when compared to the openings of the second subset of openings of identical size. The openings of the first set are all aligned along a first direction, and the openings of the second set are all aligned along a second direction, the first direction and the second direction being the same.

For all of the embodiments, the patterns defined by the openings in the template layer may have a substantially uniform pattern density, and may have the same depth.

In the illustrated embodiments, the openings in the template layer are rectangular or square in cross-section along a plane parallel to a main front surface of the substrate, but the disclosure is not limited thereto.

Figure 5A:
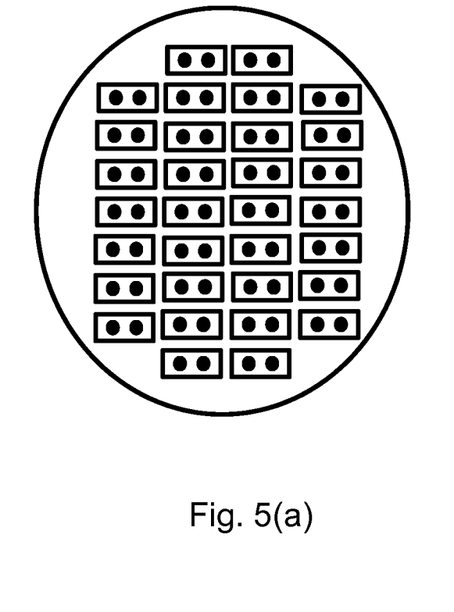
FIGS. 5(a) and (b) illustrates the formation of vias or through holes formed by the DSA process in the template openings, according to embodiments of the present disclosure.

FIGS. 5(a) and (b) illustrate the formation of vias or through holes formed by the DSA process in the template openings, according to embodiments of the present disclosure, in correspondence with the embodiments described in relation with FIGS. 4(a) and 4(c) respectively. In FIG. 5(a), the openings have the same size and comprise dimensions adapted as to form two-hole ("pig nose") structures in the BCP, for the predetermined BCP material, based on predetermined natural periodicity of the BCP material.

Figure 5B:
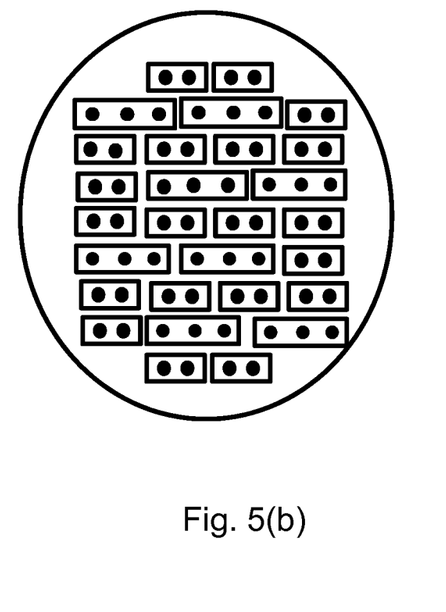

In FIG. 5(b), there are two subsets of openings of identical size, the respective sizes of openings of the first subset and of the second subset being predetermined such that respectively two vias and three vias are formed in the openings for the predetermined BCP material used, based on the predetermined natural periodicity of the BCP material. For instance, BCP (PS-b-PMMA) can be used with a value for $L_0$ of 37 nm, which will generate 15-17 nm diameter holes in the templated DSA process (particularly the pig-nose hole type). This means that with a value for $L_0$ of 37 nm, the dimensions of the trenches/openings in the template layer are preferably 74 nm×148 nm to have two contact holes in each trench and 74 nm×222 nm to have three contact holes in each trench.

If $L_0$ would be 28 nm, for example, the template layer openings/trenches are of dimension 56 nm×112 nm for two via holes and 56 nm×168 nm for three via holes.

The trench dimension can be defined by a length (L) and a width (W), wherein $L=i \times L_0$ and $W=j \times L_0$, i and j being integer values. The dimensions of the template openings/trenches are thus predetermined for a predetermined BCP system, based on the specific $L_0$ value.

For instance, to get two holes inside the template openings/trenches, (i,j) can be (2,4); to get three holes inside the template openings/trenches, (i,j) can be (2,6).

It will be appreciated that the templated DSA processes described in embodiments of the present disclosure embodies a new integration scheme that simplifies the DSA contact hole formation, and is compatible with current and future advanced via hole patterning.

The foregoing description details certain embodiments of the disclosure. It will be appreciated, however, that no matter how detailed the foregoing appears in text, the disclosure may be practiced in many ways.

While the above detailed description has shown, described, and pointed out novel features of the disclosure as applied to various embodiments, it will be understood that various omissions, substitutions, and changes in the form and details of the device or process illustrated may be made by those skilled in the technology without departing from the disclosure.

The invention claimed is:

1. A method for forming contact vias, comprising:
providing a substrate comprising a plurality of contact structures embedded in a first dielectric layer, wherein the contacts abut an upper surface of the first dielectric layer;
providing a second dielectric layer on the upper surface of the first dielectric layer;
providing a hardmask layer on top of the second dielectric layer;
patterning the hardmask layer to thereby remove a portion of the hardmask layer at positions where vias in the second dielectric layer are to be formed and leaving at least an upper portion of the hardmask layer at positions where no vias in the second dielectric layer are to be formed;
providing a patterned planarizing template layer on top of the patterned hardmask layer, wherein the patterned template layer includes a set of openings, wherein the set of openings are evenly distributed within the template layer and comprise a limited number of subsets of openings of identical size, and wherein at least some of the openings correspond to the positions of the contact structures;

performing a direct self assembly (DSA) process that includes:
providing a predetermined Block Copolymer (BCP) material in all of the openings of the template layer,
inducing polymer separation of the BCP in the openings, and
removing of a first component of the BCP in the openings, wherein the patterned template layer and a second component of the BCP define a pattern comprising DSA openings, and wherein the DSA openings are located at positions corresponding to the contact structures; and etching the contact vias in the second dielectric layer at positions corresponding to the contact structures, using at least the second component of the BCP as a mask.

2. The method according to claim 1, wherein providing the BCP in all of the openings of the template layer comprises filling the openings up to about 50% to 100% of a volume of the openings.

3. The method according to claim 2, wherein providing the BCP in all of the openings of the template layer comprises filling the openings up to about 50% to 60% of the volume of the openings.

4. The method according to claim 1, further comprising one subset of openings of identical size, such that all the openings have an identical size, and wherein the openings are arranged according to a regular grid pattern.

5. The method according to claim 4, wherein the openings are oriented in the same direction.

6. The method according to claim 4, wherein at least one opening is oriented in a different direction.

7. The method according to claim 1, wherein a subset of openings comprises openings with dimensions adapted as to form one-hole, two-hole, or three-hole structures in the BCP, for the predetermined BCP material, and based on predetermined natural periodicity of the BCP material.

8. The method according to claim 7, comprising only first and second subsets of openings of identical size, the respective sizes of openings of the first subset and of the second subset being predetermined such that respectively two vias and three vias are formed in the openings for the predetermined BCP material.

9. The method according to claim 1, wherein the openings in the template layer are rectangular or square.

10. The method according to claim 1, wherein providing the hardmask layer on top of the second dielectric layer comprises providing a single layer of metal material as the hardmask layer, and wherein patterning the hardmask layer is performed directly thereafter.

11. The method according claim 1, wherein providing a hardmask layer on top of the second dielectric layer comprises providing a bilayer structure comprising a first layer of a metal material and a second layer of a dielectric material directly on top of the first layer of metal material, the method further comprising patterning only the second layer of the dielectric material directly thereafter by using a lithography process that is selective to the first layer of metal material.

12. The method according to claim 11, wherein patterning the hardmask layer comprises patterning the first layer of metal material only after defining the DSA openings, and before or at the same time of etching the contact vias in the second dielectric layer.

13. The method according to claim 1, further comprising:
after patterning the hardmask layer, providing a planarizing layer or layer stack on the substrate, on top of the patterned hardmask layer and the second dielectric layer; and
patterning the planarizing layer or layer stack by using a lithography process to thereby define the patterned template layer.

* * * * *